(12) United States Patent
Li et al.

(10) Patent No.: US 12,363,958 B2
(45) Date of Patent: Jul. 15, 2025

(54) ULTRA-THIN FIN STRUCTURE AND METHOD OF FABRICATING THE SAME

(71) Applicant: Taiwan Semiconductor Manufacturing Co., Ltd., Hsinchu (TW)

(72) Inventors: Sherry Li, Hsinchu (TW); Chia-Der Chang, Hsinchu (TW); Yi-Jing Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/362,476

(22) Filed: Jul. 31, 2023

(65) Prior Publication Data

US 2023/0378271 A1    Nov. 23, 2023

Related U.S. Application Data

(60) Continuation of application No. 17/456,799, filed on Nov. 29, 2021, now Pat. No. 11,862,683, and a
(Continued)

(51) Int. Cl.
*H10D 30/69* (2025.01)
*H01L 21/02* (2006.01)
(Continued)

(52) U.S. Cl.
CPC ..... *H10D 30/751* (2025.01); *H01L 21/02532* (2013.01); *H01L 21/30604* (2013.01);
(Continued)

(58) Field of Classification Search
CPC ............. H01L 29/7853; H01L 29/0657; H01L 29/165; H01L 21/823431; H01L 27/0886;
(Continued)

(56) References Cited

U.S. PATENT DOCUMENTS 8,957,477 B2    2/2015   Chang et al.
9,093,530 B2    7/2015   Huang et al.
(Continued)

FOREIGN PATENT DOCUMENTS

CN    101752258 A    6/2010
CN    103137475 A    6/2013
(Continued)

*Primary Examiner* — Sonya McCall-Shepard
(74) *Attorney, Agent, or Firm* — Sterne, Kessler, Goldstein & Fox P.L.L.C.

(57) ABSTRACT

The present disclosure describes a method for forming ultra-thin fins with a tapered bottom profile for improved structural rigidity and gate control characteristics. The method includes forming a fin structure that includes an epitaxial layer portion and a doped region portion surrounded by an isolation region so that a top section of the epitaxial layer portion is above the isolation region. The method also includes depositing a silicon-based layer on the top portion of the epitaxial layer above the isolation region and annealing the silicon-based layer to reflow the silicon-based layer. The method further includes etching the silicon-based layer and the fin structure above the isolation region to form a first bottom tapered profile in the fin structure above the isolation region and annealing the fin structure to form a second bottom tapered profile below the first bottom tapered profile and above the isolation region.

20 Claims, 9 Drawing Sheets

Related U.S. Application Data division of application No. 16/837,510, filed on Apr. 1, 2020, now Pat. No. 11,189,697.

(51) Int. Cl.

| | | |
|---|---|---|
| *H01L 21/306* | (2006.01) | |
| *H01L 21/308* | (2006.01) | |
| *H01L 21/762* | (2006.01) | |
| *H10D 30/01* | (2025.01) | |
| *H10D 30/62* | (2025.01) | |
| *H10D 62/10* | (2025.01) | |
| *H10D 62/17* | (2025.01) | |
| *H10D 62/822* | (2025.01) | |
| *H10D 84/01* | (2025.01) | |
| *H10D 84/03* | (2025.01) | |
| *H10D 84/83* | (2025.01) | |

(52) U.S. Cl.
CPC ..... *H01L 21/76224* (2013.01); *H10D 62/292* (2025.01); *H10D 62/822* (2025.01); *H10D 84/0151* (2025.01); *H10D 84/0158* (2025.01); *H10D 84/038* (2025.01); *H10D 84/834* (2025.01)

(58) Field of Classification Search
CPC ......... H01L 29/1037; H01L 21/823807; H01L 21/02255; H01L 21/3085; H01L 29/66795; H01L 21/823821; H01L 29/785; H01L 21/02532; H01L 21/02238; H10D 30/751; H10D 62/822; H10D 84/038; H10D 62/292; H10D 30/6212; H10D 84/0167; H10D 62/117; H10D 84/0158; H10D 84/834; H10D 30/024; H10D 30/62; H10D 84/0193
See application file for complete search history.

(56) References Cited

U.S. PATENT DOCUMENTS

| | | |
|---|---|---|
| 9,171,929 B2 | 10/2015 | Lee et al. |
| 9,209,269 B2 | 12/2015 | Yin et al. |
| 9,214,555 B2 | 12/2015 | Oxland et al. |
| 9,236,267 B2 | 1/2016 | De et al. |
| 9,508,834 B1 | 11/2016 | Lee et al. |
| 9,520,482 B1 | 12/2016 | Chang et al. |
| 9,548,303 B2 | 1/2017 | Lee et al. |
| 9,559,099 B2 * | 1/2017 | Lee ............... H01L 21/02694 |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 11,189,697 B2 | 11/2021 | Li et al. |
| 11,854,901 B2 | 12/2023 | Yen et al. |
| 11,862,683 B2 | 1/2024 | Li et al. |
| 2008/0296667 A1 | 12/2008 | Mikasa |
| 2010/0144121 A1 | 6/2010 | Chang et al. |
| 2014/0197457 A1 | 7/2014 | Wang et al. |
| 2015/0008484 A1 | 1/2015 | Cea et al. |
| 2016/0111544 A1 | 4/2016 | Cheng et al. |
| 2016/0322358 A1 | 11/2016 | Ching et al. |
| 2016/0359001 A1 | 12/2016 | Cheng et al. |
| 2017/0005002 A1 | 1/2017 | Ching et al. |
| 2017/0288056 A1 | 10/2017 | Balakrishnan et al. |
| 2018/0053848 A1 | 2/2018 | Balakrishnan et al. |
| 2018/0175037 A1 | 6/2018 | Brunco |
| 2018/0212066 A1 | 7/2018 | Cheng et al. |
| 2018/0247938 A1 | 8/2018 | Cheng et al. |
| 2019/0097054 A1 | 3/2019 | Kim et al. |
| 2020/0006084 A1 | 1/2020 | Tsai et al. |

FOREIGN PATENT DOCUMENTS

| | | |
|---|---|---|
| CN | 110875188 A | 3/2020 |
| DE | 10 2019 131 057 A1 | 6/2020 |
| KR | 10 2016 0129667 | 11/2016 |
| KR | 10 2017 0003347 | 1/2017 |
| KR | 10 2019 0036892 | 4/2019 |
| KR | 10 2020 0001444 | 1/2020 |

* cited by examiner

ULTRA-THIN FIN STRUCTURE AND METHOD OF FABRICATING THE SAME

CROSS-REFERENCE TO RELATED APPLICATION

This application is a continuation application of U.S. patent application Ser. No. 17/456,799, filed on Nov. 29, 2021 and titled "Ultra-Thin Fin Structure and Method of Fabricating the Same," which is a divisional application of U.S. patent application Ser. No. 16/837,510, filed on Apr. 1, 2020 and titled "Ultra-Thin Fin Structure and Method of Fabricating the Same," which was filed on Apr. 1, 2020 and issued as U.S. Pat. No. 11,189,697 on Nov. 30, 2021, which are incorporated herein by reference in their entireties.

BACKGROUND

Fin field effect transistors (finFETs) can have ultra-thin fin structures for improved gate control over the channel region. However, ultra-thin fin structures are prone to bending or collapsing during the formation of isolation regions between the ultra-thin fin structures and/or during other fabrication processes. This is because ultra-thin fin structures lack the structural integrity of thicker fin structures.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1A:
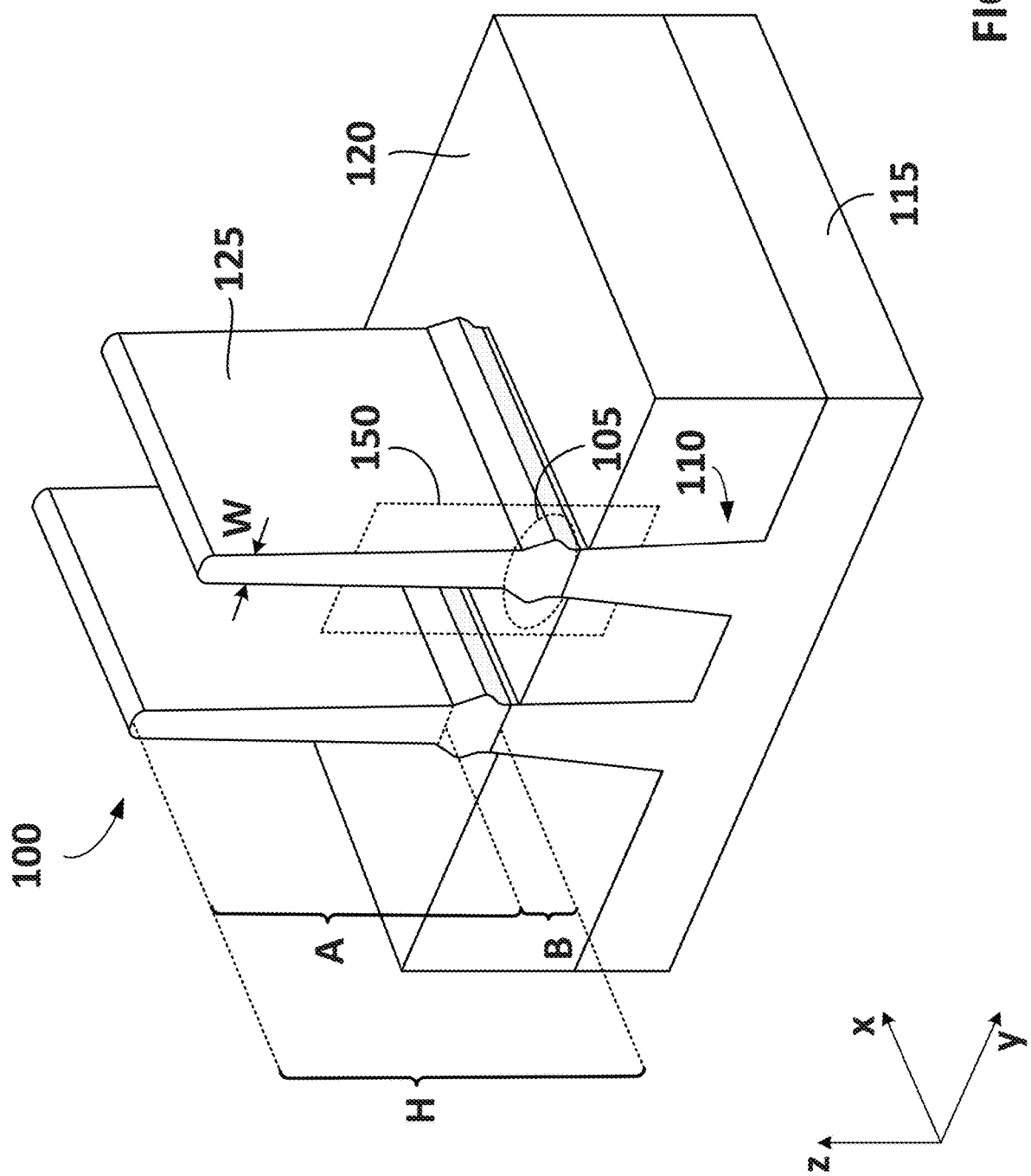
FIG. 1A is an isometric view of fin structures with tapered bottom profiles made of a silicon epitaxial layer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes and/or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "about" and "substantially" can refer to a percentage of the values as interpreted by those skilled in relevant art(s) in light of the teachings herein.

Ultra-thin fin structures—e.g., with an average width between about 5 nm and about 15 nm—used in fin field-effect transistors (finFETs) provide improved gate control over the channel region and alleviate issues related to short-channel effects. For these reasons, ultra-thin fin structures are attractive for finFETs. However, the aforementioned benefits of the ultra-thin fin structures are compromised by their limited saturation current—e.g., due to their reduced width—and lack of structural rigidity compared to thicker fin structures (e.g., thicker than about 20 nm). For example, ultra-thin fin structures can be susceptible to bending or collapsing under mechanical stress originating from the surrounding layers (e.g., dielectrics) and/or subsequent fabrication operations—e.g., densification processes that cause stress build up near the ultra-thin structures.

To address the aforementioned challenges, this disclosure is directed to a method for forming ultra-thin fins with a tapered bottom profile for improved structural rigidity while maintaining desirable gate control characteristics. In some embodiments, silicon and silicon-germanium (SiGe) ultra-thin fins can be fabricated using the methods described herein. Further, SiGe fins with a Ge variable concentration and a tapered bottom profile can be formed in p-type finFETs for improved gate control over the channel and interface quality between the ultra-thin fin structure and the gate dielectric stack.

According to some embodiments, FIG. 1A is a partial isometric view of ultra-thin fin structures 100 (fin structures 100) having a bottom tapered profile 105 which substantially improves the structural stiffness of fin structures 100. In some embodiments, fin structures 100 are formed on pedestal structures 110 of substrate 115 prior to the formation of a gate stack not shown in FIG. 1.

Fin structures 100 have a top width W between about 5 nm and about 15 nm and a total height H between about 40 nm and about 70 nm. Height H of each fin structure 100 is measured from the interface between fin structure 100 and pedestal structure 110 of substrate 115 and includes height B, which corresponds to the total height of bottom tapered profile 105, and height A—the height of fin structure 100 above bottom tapered profile 105. In some embodiments, height H is substantially equal to the sum of heights A and B (e.g., H=A+B) as shown in FIG. 1A. In some embodiments, height A is between about 80% and about 90% of height H (e.g., 80% H≤A≤90% H) and height B is between about 10% and about 20% of height H (e.g., 10% H≤B≤20% H). For example, if H is between about 40 nm and about 70 nm, height A is between about 32 nm and about 63 nm and height B (e.g., the height of bottom tapered profile 105) is between about 4 nm and about 14 nm.

In some embodiments, if height B is less than about 10% of height H, bottom tapered profile 105 may not be sufficiently thick to structurally support fin structure 100. For example, if height B is less than about 10% of height H, fin structure 100 may become susceptible to bending or collapsing. On the other hand, if height B is larger than about 20% of height H (e.g., if bottom tapered profile 105 occupies a larger portion of fin structure 100), then the channel control in the vicinity of bottom tapered profile 105 may be limited. Therefore, the size of bottom tapered profile 105 in fin structure 100 (e.g., height B), needs to be tailored so that fin structures 100 exhibit an optimal balance between mechanical stiffness and electrical performance.

As shown in FIG. 1A, fin structures 100 are isolated by an isolation material 120 which includes a dielectric material such as silicon oxide, carbon containing silicon oxide, hydrogen and nitrogen containing silicon oxide, or any other suitable dielectric material or layers.

Pedestal structures 110 can be formed from substrate 115 and can include one or more doped regions not shown in FIG. 1A. For example, a top portion of pedestal structure 110 (e.g., below bottom tapered profile 105) can be doped with n-type or p-type dopants to prevent leakage current between fin structures 100 and substrate 115 during the finFET operation. In some embodiments, substrate 115 is a bulk semiconductor wafer or a top layer of a semiconductor on insulator (SOI) wafer such as, for example, silicon on insulator. Further, substrate 115 can be made of silicon or another elementary semiconductor such as, for example, (i) germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof. In some embodiments, substrate 115 has a crystalline microstructure—e.g., it is not amorphous or polycrystalline.

For example purposes, substrate 115 and pedestal structures 110 will be described in the context of crystalline silicon (Si) with their top surface parallel to the (100) crystal plane. Based on the disclosure herein, other materials, as discussed above, or crystalline orientations can be used. These materials are within the spirit and scope of this disclosure.

Figure 1B:
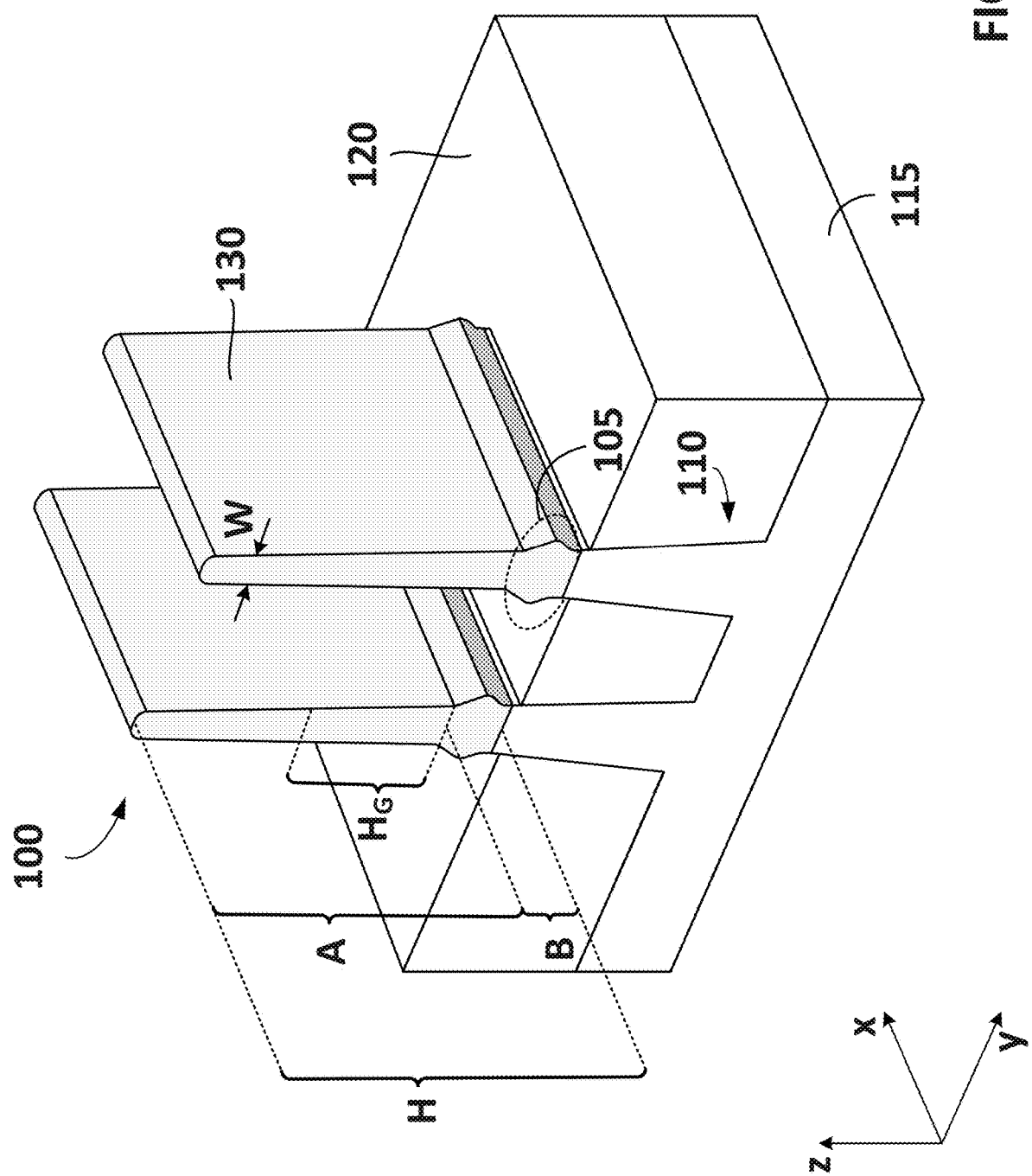
FIG. 1B is an isometric view of fin structures with tapered bottom profiles made of a silicon germanium epitaxial layer, in accordance with some embodiments.
Figure 1C:
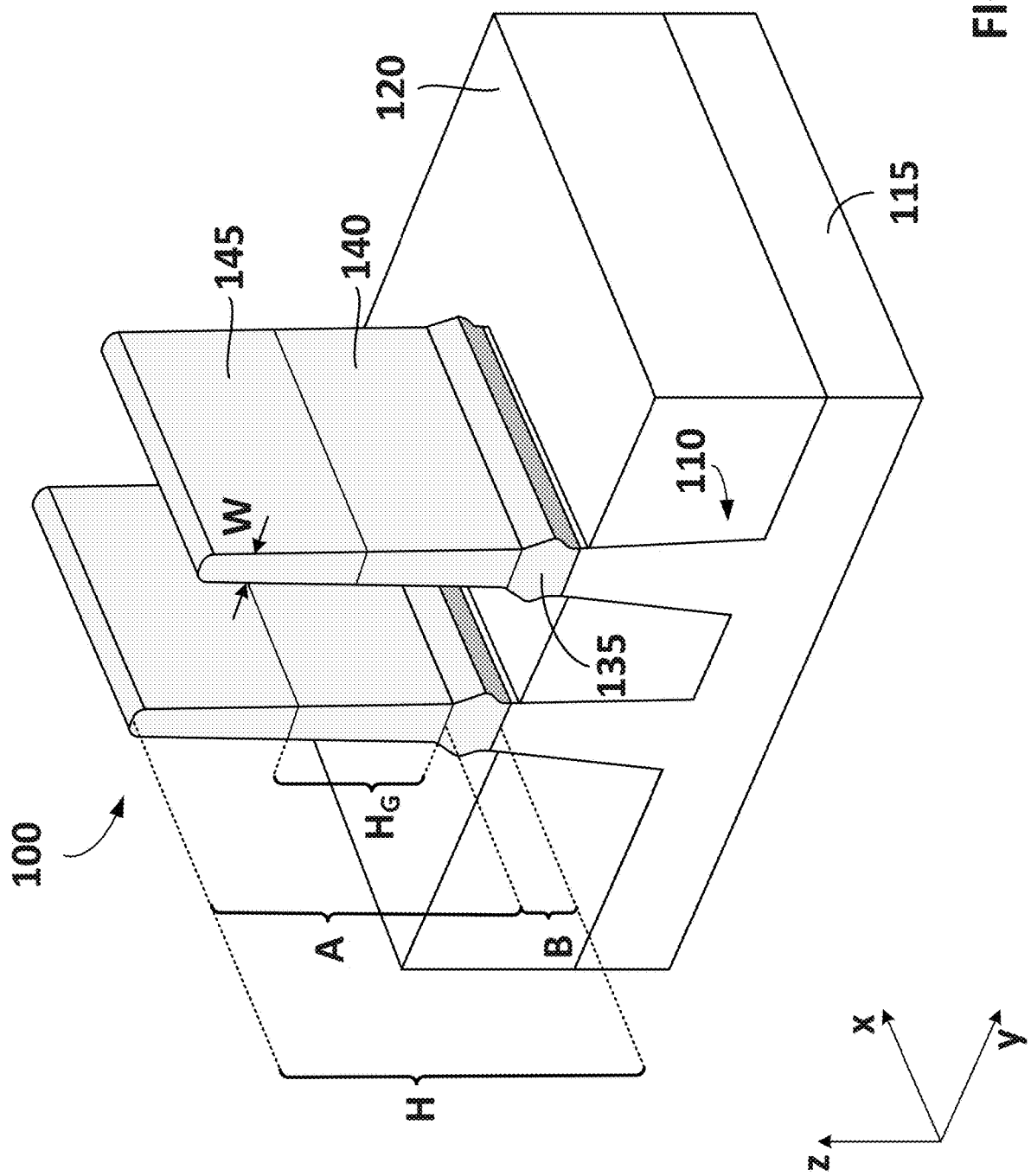
FIG. 1C is an isometric view of fin structures with tapered bottom profiles made of a silicon epitaxial stack, in accordance with some embodiments.

According to some embodiments, bottom tapered profile 105 of fin structures 100 is formed above the top surface of isolation material 120 as shown in FIG. 1A In some embodiments, fin structures 100 can include a single epitaxial layer or a stack of epitaxial layers. For example, fin structures 100 can include a single Si epitaxial layer 125 as shown in FIG. 1A, a single SiGe epitaxial layer 130 as shown in FIG. 1B, or a stack of SiGe epitaxial layers 135, 140, and 145 shown in FIG. 1C. In some embodiments, fin structures 100 with single silicon epitaxial layer 125 shown in FIG. 1A are suitable for n-type finFETs (e.g., nFETs). Fin structures 100 with single SiGe epitaxial layer 130 or a stack of SiGe epitaxial layers 135, 140, and 145 shown in FIGS. 1B and 1C are suitable for p-type finFETs (pFETs). In some embodiments, fin structures 100 for both nFETs and pFETs as shown in FIGS. 1A-C can be formed on the same substrate (e.g., substrate 115) with the methods described herein.

In some embodiments, fin structures 100 are pFET fin structures made from single SiGe epitaxial layer 130, as shown in FIG. 1B, have a Ge atomic concentration (at. %) that varies as a function of height H. For example, in referring to FIG. 1B, single SiGe epitaxial layer 130 has a Ge concentration that varies from about 10 atomic % (at. %) to about 25 at. % along height A of fin structure 100, and a Ge concentration that varies from about 25 at. % to about 35 at. % along height B of bottom tapered profile 105. In some embodiments, the Ge "peak" concentration within an area defined by height A is located towards the bottom of height A—for example, within an area of fin structure 100 defined by a height $H_G$, above bottom tapered profile 105. In some embodiments, height $H_G$ ranges between about ⅓ and ⅔ of height H of fin structure 100. For example, if the total fin height H is about 60 nm, height $H_G$ can range between about 20 nm and about 40 nm.

Figure 1D:
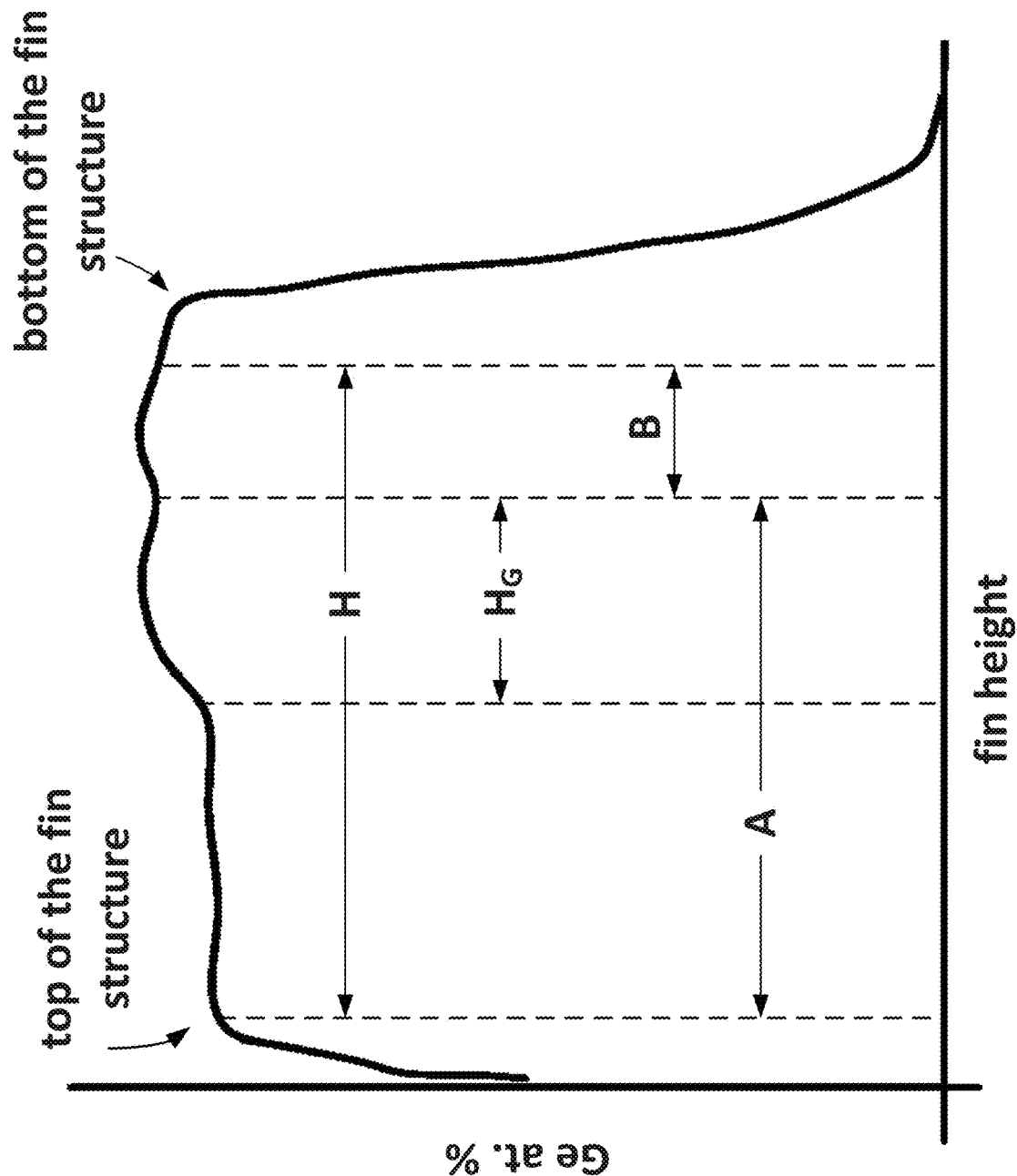
FIG. 1D is a germanium concentration plot along a fin structure with a tapered bottom profile made of a single silicon germanium epitaxial layer or a silicon germanium epitaxial stack, in accordance with some embodiments.

In some embodiments, FIG. 1D shows the Ge at. % as a function of height H of fin structure 100 shown in FIG. 1B. As discussed above with respect to FIG. 1B, within the "boundaries" of height A, the peak Ge at. % can be found within an area of the fin structure 100 defined by height $H_G$, which extends between about ⅓ and ⅔ of height H of fin structure 100. Additionally, the Ge at. % can be even higher within bottom tapered profile 105 (e.g., along height B) as described above and shown in FIG. 1D. The Ge at. % profile shown in FIG. 1D can be achieved during the growth of the SiGe epitaxial layer by tuning the deposition process conditions as will be discussed later.

In some embodiments, a similar Ge profile to that shown in FIG. 1D can be achieved for fin structures 100 shown in FIG. 1C, which includes SiGe epitaxial layers 135, 140, and 145. For example, SiGe epitaxial layers 135, 140, and 145 can be grown with different Ge concentrations that replicate the Ge profile shown in FIG. 1D. By way of example and not limitation, epitaxial layer 145 can be grown with the lowest Ge concentration, epitaxial layer 140 can be grown with a Ge concentration greater than that of epitaxial layer 145 and with a thickness equal to about height $H_G$, and epitaxial layer 135 can be grown to form bottom tapered profile 105 with a Ge concentration greater than that of epitaxial layer 140 and a thickness equal to about height B. The above description of SiGe epitaxial layers 135, 140, and 145 is not limiting and a stack with two layers instead of three can be formed. For example, SiGe epitaxial layers 135 and 140 can be combined to a single SiGe epitaxial layer. Additional SiGe epitaxial layers are also possible and are within the spirit and the scope of this disclosure.

Figure 3:
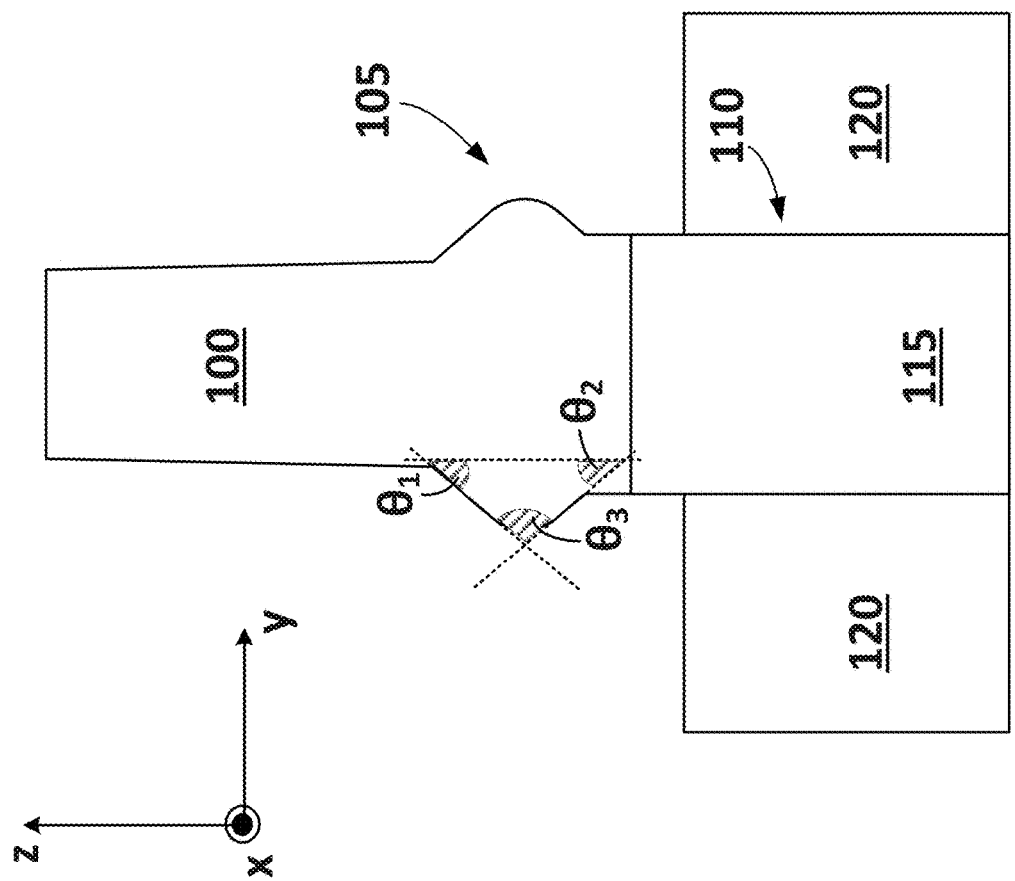
FIGS. 2 and 3 are partial cross-sectional views of fin structures with tapered bottom profiles.
Figure 2:
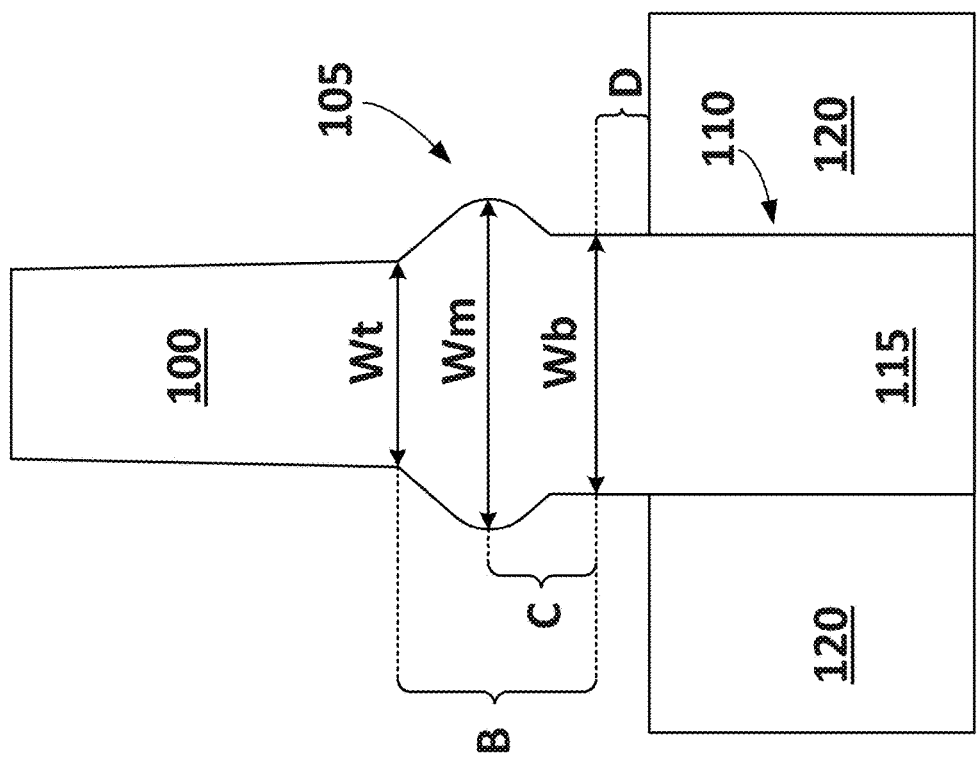

In some embodiments, FIGS. 2 and 3 are magnified cross-sectional views of structural elements included in rectangular 150 of FIG. 1A. The features shown in FIGS. 2 and 3 apply equally to fin structures 100 shown in FIGS. 1B and 1C. In referring to FIG. 2, bottom tapered profile 105 has a top width Wt between about 5 nm and about 15 nm, a middle width Wm between about 8 nm and about 20 nm, and a bottom width Wb between about 7 nm and about 18 nm. In some embodiments, width Wb is larger than width Wt, and width Wm is larger than both widths Wt and Wb. For example, Wm>Wb>Wt. In some embodiments, ratio Wt/Wm is between about 0.25 and about 0.75 (e.g., 0.25≤Wt/Wm≤0.75); and ratio Wb/Wm is between about 0.35 and about 0.90 (e.g., 0.35≤Wb/Wm≤0.90). In some embodiments, ratios Wt/Wm and Wb/Wm less than about 0.25 and 0.35, respectively, can produce exaggerated tapered profiles with limited channel control in the tapered area of fin structure 100. In some embodiments, ratios Wt/Wm and Wb/Wm greater than about 0.75 and 0.90, respectively, can produce tapered profiles incapable of providing adequate structural support for fin structures 100. In some embodiments, width Wt of bottom tapered profile 105 is substantially equal to or larger than top width W of fin structure 100 shown in FIG. 1 (e.g., Wt≥W). Therefore, it is possible that fin structures 100 are narrow at the top of fin structure 100 (e.g., the upper portion above the bottom tapered portion) and increase in width along height A (e.g., W<Wt). In some embodiments, the width of fin structures 100 along height A is constant (e.g., W=Wt) and increases within height B of bottom tapered profile 105.

In some embodiments, width Wm of bottom tapered profile 105 is spaced from the interface between pedestal structure 110 and fin structure 100 by a vertical distance C that ranges between about 1 nm and about 3 nm. In some embodiments, vertical distance C is between about ⅓ and about ½ of height B (e.g., the entire height of bottom tapered profile 105). In some embodiments, a CB ratio below about ⅓ will "move" Wm closer to Wb. This will produce a challenging geometry for the deposition of gate layers. For example, it would be challenging to conformally deposit the gate layers (e.g., high-k dielectric layer, work function layers, etc.) on portions of bottom tapered profile 105 between Wm and Wb, which can result in an undesirable threshold voltage variation between the FETs. On the other hand, a CB ratio above about ½ will "move" Wm closer to Wt, which will weaken the structural integrity of fin structure 100.

In some embodiments, the interface between pedestal structure 110 and fin structure 100 is positioned above the top surface of isolation material 120 by a vertical distance D that ranges between about 4 nm and about 15 nm.

As discussed above, fin structures 100, have wide and narrow portions along height H to improve their structural stiffness. However, under the same gate biasing conditions, the gate control on wider portions of fin structures 100 (e.g., at the locations of Wt, Wm, and Wb) can be challenging. According to some embodiments, the Ge concentration can be used to "locally" reduce the Vt over the wider portions of fin structures 100 and improve the gate control. This is because Ge has a narrower bandgap than Si; therefore, areas with a higher concentration in Ge (e.g., within the area defined by height $H_G$ and bottom tapered profile 105) can have a lower Vt compared to areas with a lower concentration of Ge (e.g., at the top of fin structure 100). Consequently, increasing the Ge concentration in wider portions of fin structures 100, effectively reduces the Vt in the wider portions and improves the gate control over the channel. According to some embodiments, tailoring the Ge concentration in the fin structures can be beneficial for the operation of the finFET and ensures a substantially constant saturation current along height H of fin structure 100. In some embodiments, the Ge concentration in the Ge-rich areas of fin structure 100 can reach to about 50%.

According to some embodiments, width Wm of bottom tapered profile 105 shown in FIG. 2 is a critical structural parameter used to tailor the structural stiffness of fin structure 100. As discussed above, width Wm can range from about 8 nm to about 20 nm. If width Wm is less than about 8 nm, bottom tapered profile 105 is not wide enough to adequately provide structural support for fin structure 100. Conversely, if width Wm is greater than about 20 nm, channel control within bottom tapered profile 105 becomes challenging even with a higher Ge concentration.

In some embodiments, control of width Wm is provided via angles $\theta_1$ and $\theta_2$ on each side of bottom tapered profile 105 shown in FIG. 3. In some embodiments, angles $\theta_1$ and $\theta_2$ between about 10° and about 30° provide a width Wm between about 8 nm and about 20 nm. Therefore, angles $\theta_1$ and $\theta_2$ below about 10° result in a width Wm below about 8 nm and angles $\theta_1$ and $\theta_2$ wider than about 30° result in a width Wm greater than about 20 nm. In some embodiments, middle width Wm and angles $\theta_1$ and $\theta_2$ are controlled via etching and annealing conditions used during and after the formation of fin structures 100. In some embodiments, angle $\theta_3$ ranges between about 120° and about 160°.

In some embodiments, angles $\theta_1$ and $\theta_2$ prevent sidewall portions of bottom tapered profile 105 from being co-planar with sidewall portions of fin structure 100 above and below bottom tapered profile 105. Further, angles $\theta_1$ and $\theta_2$ prevent sidewall portions of bottom tapered profile 105 from being co-planar with sidewall portions of pedestal structures 110 as shown in FIG. 3.

Figure 4:
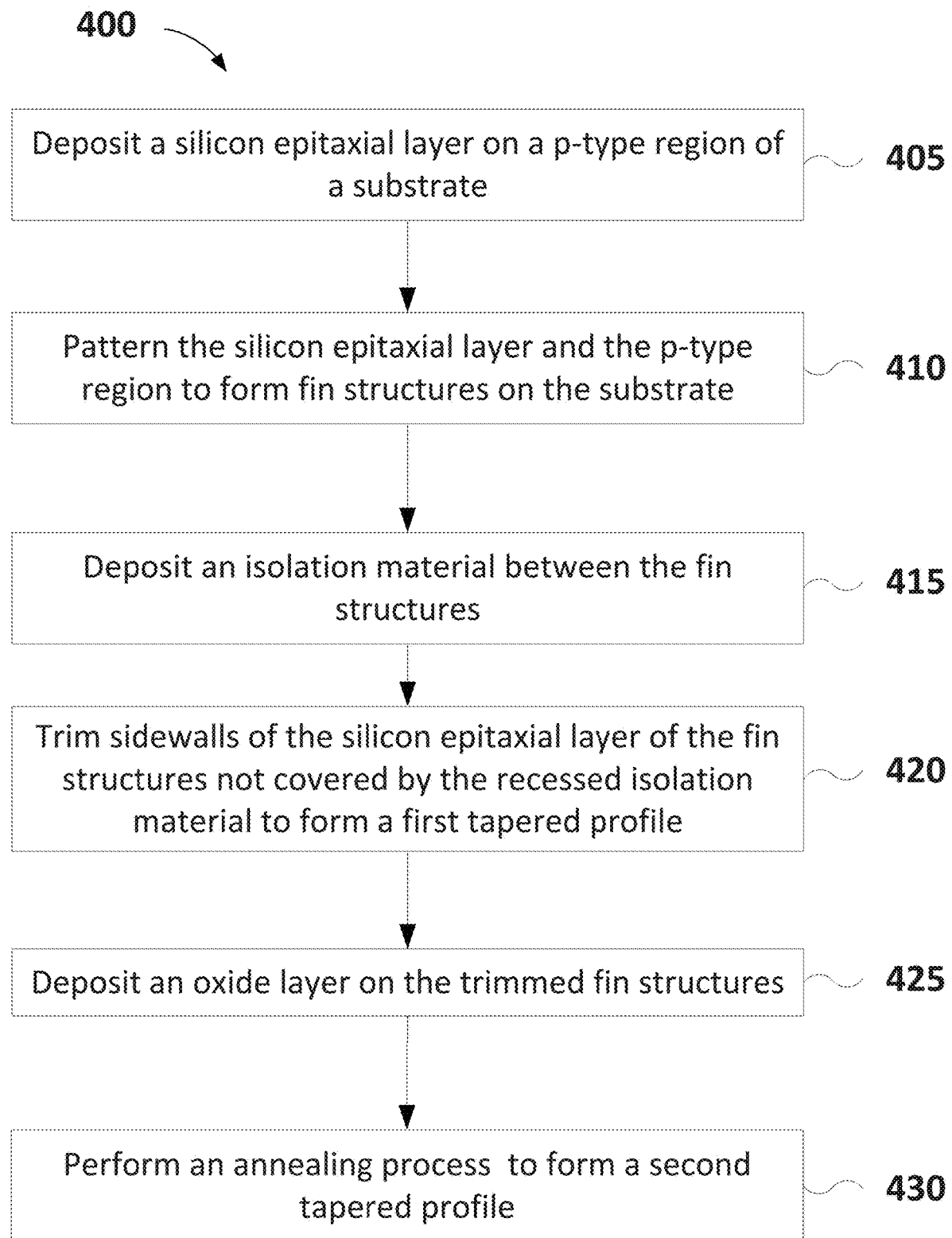
FIG. 4 is a flowchart diagram of a fabrication method for forming fin structures with tapered bottom profiles, in accordance with some embodiments.

FIG. 4 is a flowchart of fabrication method 400 for the formation of fin structures 100 shown in FIG. 1A. Other fabrication operations may be performed between the various operations of method 400 and may be omitted merely for clarity and ease of description. These various operations are within the spirit and the scope of this disclosure. Additionally, not all operations may be required to perform the disclosure provided herein. Some of the operations may be performed simultaneously, or in a different order than the ones shown in FIG. 4. In some embodiments, one or more other operations may be performed in addition to or in place of the presently described operations. Method 400 will be described in reference to FIGS. 5-10. The figures provided to describe method 400 are for illustrative purposes only and may not be to scale. In addition, the figures may not reflect the actual geometry of the real structures, features, or films. Some structures, films, or geometries may have been deliberately augmented or omitted for illustrative purposes.

Figure 5:
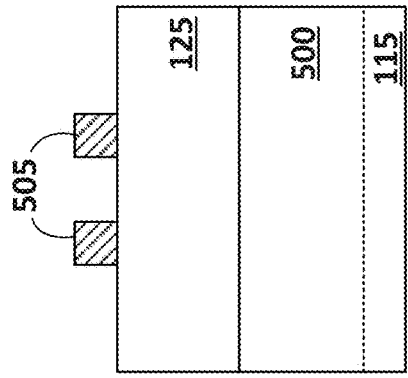

In referring to FIG. 4, method 400 begins with operation 405 and the process of depositing a Si epitaxial layer on a p-type region of a substrate, such as substrate 115 shown in FIG. 1A. By way of example and not limitation, and according to operation 405 of method 400, Si epitaxial layer 125 can be grown directly on a p-type region 500 of substrate 115 as shown in FIG. 5. P-type region 500 can be formed, for example, with an ion implant process using a p-type dopant such as boron (B) and having a dopant concentration that ranges from about $5\times10^{16}$ atoms/cm$^3$ to about $1\times10^{19}$ atoms/cm$^3$. Si epitaxial layer 125 can be grown to a thickness between about 30 nm and about 100 nm using a chemical vapor deposition (CVD) process. Source gases for the silicon epitaxial formation can include silane ($SiH_4$), silicon tetrachloride ($SiCl_4$), trichlorosilane (TCS), or dichlorosilane ($SiH_2Cl_2$ or DSC). Hydrogen ($H_2$) can be used as a reactant gas that reduces the aforementioned source gases. The deposition temperature during the epitaxial layer growth can range from about 700° C. to about 1250° C. depending on the gases used. For example, source gases with fewer chlorine atoms (e.g., DSC) may require lower formation temperatures than source gases with more chlorine atoms, such as $SiCl_4$ or TCS. The aforementioned ranges and type of gases are provided as examples and are not limiting.

In referring to FIG. 4, method 400 continues with operation 410 and the process of patterning Si epitaxial layer 125 and p-type region 500 to form fin structures on substrate 115. In some embodiments, patterning of Si epitaxial layer 125 and p-type region 500 is achieved with photolithography and etching operations using hard mask structures 505 shown in FIG. 5. In some embodiments, hard mask structures 505 function as an etch mask and can include one or more layers such as silicon oxide and silicon nitride. Fin structures may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. In some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures. According to some embodiments, FIG. 5 shows the final patterning operation for the formation of the fin structures where hard mask structures 505 can be the remaining spacers disposed on Si epitaxial layer 125.

Figure 6:
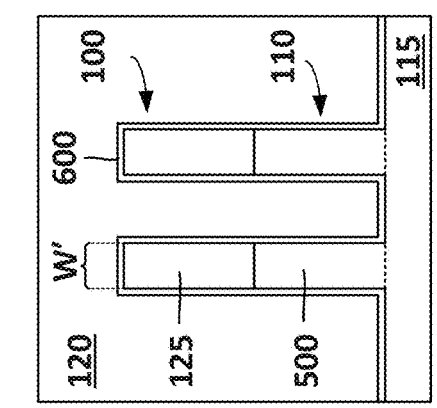

According to some embodiments, FIG. 6 shows the resulting fin structures 100 formed according to operation 410 described above. Additional fin structures 100 can be formed on substrate 115 according to operation 410 by using additional hard mask structures. In some embodiments, the width and length of hard mask structures 505 along the y-axis and x-axis defines the width and length of fin structures 100 shown in FIG. 6. Further, the spacing between hard mask structures 505 defines the spacing between fin structures 100. Therefore, by controlling the dimensions of hard mask structure 505, the dimensions of fin structure 100 can be defined. In some embodiments, width W' of fin structures 100 after operation 410 is between about 7 nm and about 18 nm, which can be similar or thicker than Wb shown in FIG. 2.

In referring to FIG. 4, method 400 continues with operation 415 and the process of depositing an isolation material between fin structures 100. Depositing the isolation material includes the deposition of a liner layer 600 over fin structures 100 as shown in FIG. 6. By way of example and not limitation, liner layer 600 functions as an adhesion layer for the isolation material. By way of example and not limitation, liner layer 600 can be deposited with a conformal deposition process, such as plasma-enhanced atomic layer deposition (PEALD), at a thickness between about 2 nm and 4 nm. By way of example and not limitation, liner layer 600 can be a silicon oxide or a silicon oxide-based dielectric material.

Subsequently, an isolation material 120 is deposited to surround fin structures 100 as shown in FIG. 6. In some embodiments, isolation material 120 is deposited at a thickness about 3 times height H of fin structures 100 shown in FIG. 1A. According to some embodiments, isolation material 120 is deposited with a flowable chemical vapor deposition process (e.g., flowable CVD) to ensure that isolation material 120 fills the space between fin structures 100 without forming seams or voids. In some embodiments, isolation material 120 is a silicon oxide based dielectric material that includes, for example, nitrogen and hydrogen. To further improve its dielectric and structural properties, isolation material 120 may be subjected to a wet steam anneal (e.g., 100% water molecules) at a temperature between about 600° C. and 1200° C. During the wet steam anneal, isolation material 120 densifies and its oxygen content increases.

Figure 7:
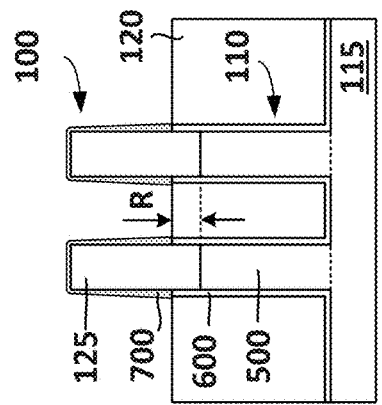
FIGS. 5-10 are cross-sectional views describing the fabrication process of fin structures with tapered bottom profiles, in accordance with some embodiments.
Figure 9:
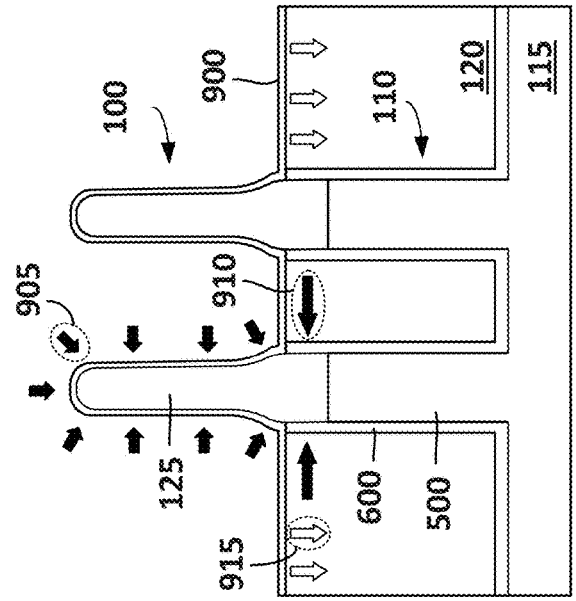

Subsequently, a chemical mechanical planarization (CMP) process polishes isolation material 120 until top surfaces of fin structures 100 are exposed. During the aforementioned CMP process, the portions of liner layer 600 on the top surfaces of fin structures 100 are removed. A dry etching process "pulls back" (e.g., selectively etches) liner layer 600 and isolation material 120 to expose top portions of fin structures 100 as shown in FIG. 7. This is because the gas chemistry used in the etch process of isolation material 120 is also selective towards liner layer 600. In some embodiments, the etch process includes, but is not limited to, fluorocarbon chemistry. As a result of the aforementioned etch process, the top portions of fin structures 100 are exposed while the bottom portions remain embedded in isolation material 120. In some embodiments, isolation material 120 is etched so that the top surface of recessed isolation material 120 is spaced from the interface between pedestal structure 110 and Si epitaxial layer 125 by a vertical distance R. In some embodiments, vertical distance R is substantially equal to vertical distance C shown in FIG. 2 (e.g., between about 1 nm and 3 nm). In other words, isolation material 120 is etched approximately to the level of width Wm shown in FIG. 2.

In referring to FIG. 4, method 400 continues with operation 420 and the process of "trimming" (e.g., etching) the sidewalls of silicon epitaxial layer 125 of fin structures 100 not covered by isolation material 120—for example, by trimming the exposed portions of fin structures 100. In some embodiments, trimming (e.g., etching) the sidewalls of silicon epitaxial layer 125 includes selectively depositing a silicon-based layer on silicon epitaxial layer 125, reflowing the silicon-based layer so that the silicon-based layer becomes thinner on the top of fin structures 100 and thicker towards the bottom of fin structures 100, and subsequently etching the silicon-based layer and the silicon epitaxial layer 125 to form an initial or first tapered profile.

In some embodiments, the silicon-based layer is a silicon epitaxial layer selectively deposited on top and sidewall surfaces of fin structures 100 in a conformal manner at a thickness between about 1 nm and about 2 nm. As a result, the silicon-based material does not grow on isolation material 120. In some embodiments, the two-stage annealing process includes a pre-soak at a temperature between about 600° C. and about 700° C. for about 10 s to about 30 s, followed by a spike anneal at a temperature between about 800° C. and about 1000° C. for about 1 ms. The re-flow process is configured to redistribute the silicon-based material on fin structures 100. In some embodiments, about 0.5 nm to about 1 nm of the silicon-based material is redistributed between the top and the bottom of fin structures 100.

For example, after the re-flow process, the thickness of silicon-based layer can be about 3 nm at the bottom of fin structures 100 and about 1 nm at the top of fin structures 100. FIG. 7 shows silicon-based layer 700 after the aforementioned deposition and reflow processes.

Figure 8:
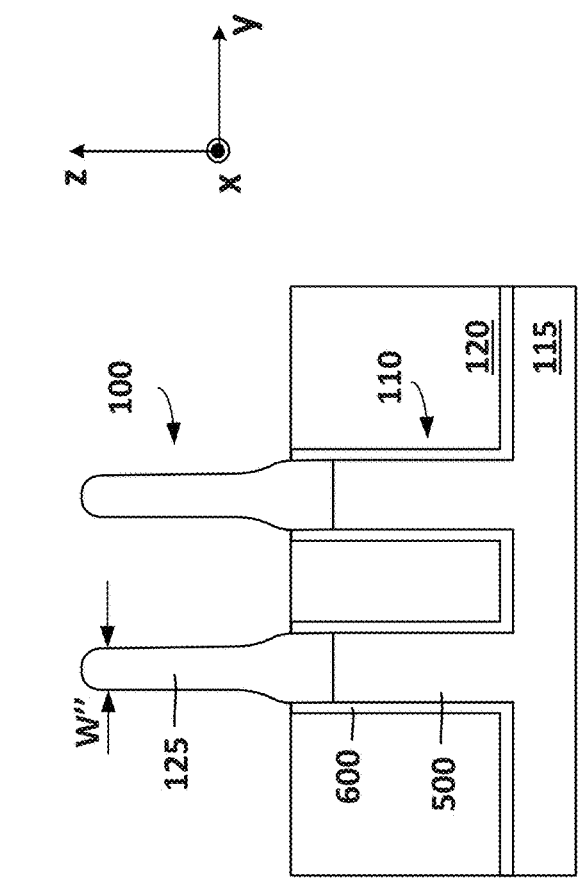

A subsequent etching process, selective to silicon-based layer 700 and silicon epitaxial layer 125, begins to remove silicon-based layer 700. Due to the non-conformal distribution of silicon-based layer 700 after the reflow process, silicon epitaxial layer 125 at the top of fin structures 100 is exposed sooner to the etching chemistry than silicon epitaxial layer 125 at the bottom of fin structures 100 where silicon-based layer 700 is thicker. Consequently, the top portion of fin structures 100 is exposed for a longer period of time to the etching chemistry than the bottom portion. This intentional exposure time difference to the etching chemistry is responsible for the formation of an initial or first tapered profile in fin structures 100. The resulting fin structures 100 are shown in FIG. 8. By way of example and not limitation, fin structures 100 develop rounding top corners after the etching process as shown in FIG. 8. Further, after the etching process, top width W" has been reduced compared to the initial top width W' shown in FIG. 6 (e.g., W"<W). In some embodiments, W" can be substantially equal to or greater than about W shown in FIG. 1A (e.g., W"≥W).

In some embodiments, thicker silicon-based layers (e.g., thicker than about 2 nm) and longer reflow times can be used to generate more pronounced tapered profiles (e.g., bottom tapered profiles with a larger width Wm). However, such conditions may substantially increase the overall processing time and fabrication cost. On the other hand, thinner silicon-based layers (e.g., thinner than about 2 nm) may not produce the desired tapered profile (e.g., the desired difference between the top and bottom widths).

In some embodiments, the thickness of the silicon-based layer and the reflow conditions (e.g., annealing duration and temperature) can be used to tune the thickness difference between the top and bottom sidewall coverage on fin structures 100 and to produce the desired tapered profile. More specifically, the aforementioned processes can be used to define angle $\theta_1$ shown in FIG. 3. Further, in some embodiments, operation 420 may be repeated to fine tune the desired initial tapered profile and top width for fin structures 100.

In some embodiments, the aforementioned etching process includes a combination of a wet etching and a dry etching. In some embodiments, the wet etching process is used for the main etch (e.g., to trim fin structures 100) and the dry etching process is used to remove byproducts formed during the main etch. In some embodiments, the etching process removes between about 10% and 20% of silicon epitaxial material from fin structures 100 (e.g., between about 4 nm and about 7 nm). By way of example and not limitation, the wet etching chemistry can include diluted hydrochloric acid (dHF), ammonia hydroxide (NH$_4$OH), and water. The dry etching process can include, for example, ozone (O$_3$) plasma. In some embodiments, the wet etching process is isotropic to ensure etching uniformity from all directions during the main etch.

In referring to FIG. 4, method 400 continues with operation 425 and the deposition of an oxide layer on the trimmed fin structures 100. For example, and in referring to FIG. 9, oxide layer 900 can be deposited to cover top and sidewall surfaces of trimmed fin structures 100 and top surfaces of isolation material 120. By way of example and not limitation, oxide layer 900 can be a sacrificial gate oxide layer, such as a silicon oxide layer or a silicon oxy-nitride layer with a thickness between about 2 nm and about 5 nm. Oxide layer 900 is replaced in a subsequent operation by a gate dielectric stack that includes a material with a high dielectric constant (e.g., with a dielectric constant greater than about 3.9).

Figure 10:
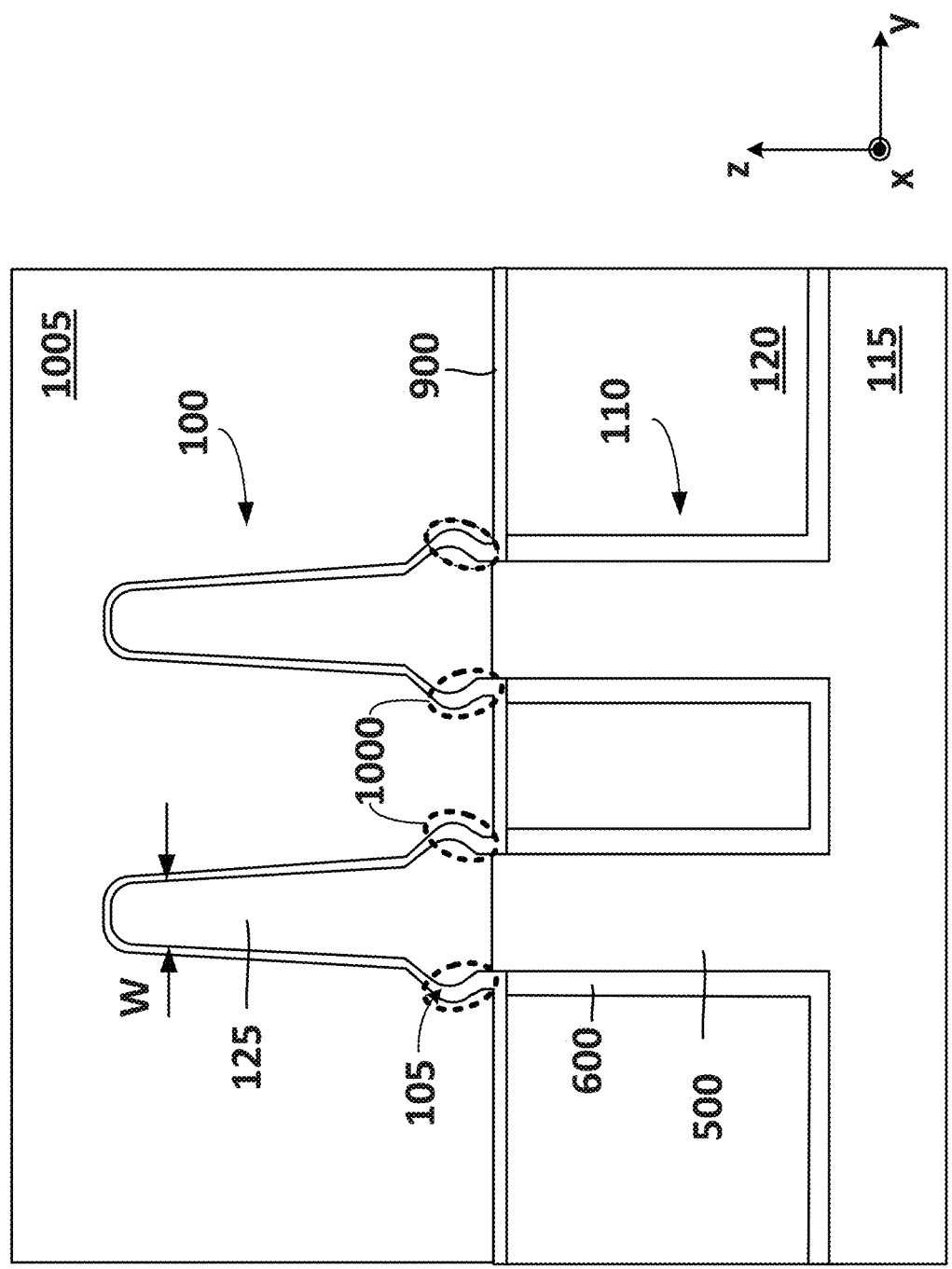

In referring to FIG. 4, method 400 continues with operation 430 and the process of performing an annealing process to form a second tapered profile shown in FIG. 10. More specifically, the annealing process of operation 430 defines angles $\theta_2$ and $\theta_3$ shown in FIG. 3. This is because, during the annealing process of operation 430, fin structures 100 are partially oxidized due to the availability of oxygen from oxide layer 900, liner layer 600, and isolation material 120 as indicated by short black arrows 905 and long black arrows 910 in FIG. 9. Since, the combined thickness of liner layer 600 and isolation material 120 is larger than the thickness of oxide layer 900, more oxygen is available for oxidation for the portions of fin structures 100 covered by liner layer 600 and isolation material 120 than for the portions of fin structures 100 covered by oxide layer 900. Therefore, portions of fin structures 100 covered by liner layer 600 and isolation material 120 will be oxidized more than portions of fin structures 100 covered by oxide layer 900. Therefore, more silicon material from fin structures 100 will be consumed for the formation of thicker oxide on portions of fin structures 100 covered by liner layer 600 and isolation material 120 than on portions of fin structures 100 covered by oxide layer 900. At the same time, during the aforementioned annealing process, isolation material 120 shrinks as indicated by white arrows 915. Hence, the height of isolation material 120 is reduced and isolation material 120 is effectively recessed to reveal bottom tapered profile 105 shown in FIG. 10.

In some embodiments, the annealing process is similar to the annealing process discussed with respect to the reflow of silicon-based layer 700 in operation 420. However, there are differences. For example, in operation 430, the temperature range for the spike anneal can be greater—e.g., between about 700° C. and about 1100° C. according to some embodiments. Additionally, the oxygen concentration during the annealing process in operation 430 is higher than that of the annealing process described in operation 420. In some embodiments, partial oxidation of fin structures 100 covered by liner layer 600 and isolation material 120 may also occur during the annealing process as discussed above with respect to the reflow of silicon-based layer 700 in operation 420. Similarly, isolation material 120 may be also recessed during the annealing process in operation 430.

Based on the aforementioned oxidation process described in operation 430, portions of oxide layer 900 on lower portions of bottom tapered profile 105, as indicated by dashed circles 1000 in FIG. 10, are grown thicker than portions of oxide layer 900 above bottom tapered profile 105. This is due to the presence of additional oxygen in the vicinity of liner layer 600 and isolation material 120 that enhances the oxidation reaction in this region. At the same time, as isolation material 120 shrinks and recesses with respect to fin structures 100, the growth of oxide layer 900 slows down since the oxygen source is removed by the recess action of isolation material 120. Therefore, bottom tapered profile 105 is formed by a combination of the etching and oxidation processes as discussed above.

According to some embodiments, angle $\theta_2$ shown in FIG. 3 can be modulated through the annealing conditions of operation 430. For example, increasing the annealing temperature (e.g., setting the annealing temperature closer to about 1100° C.) and/or the anneal time, allows oxide layer 900 to continue growing at the bottom of fin structures 100 as discussed above. A thicker oxide layer 900 means that there is a greater consumption of Si epitaxial layer 125 from fin structures 100, which results in a larger $\theta_2$ and width Wm and a narrower $\theta_3$. Conversely, an annealing temperature closer to about 700° C. and/or shorter annealing times will produce a thinner oxide layer and a lower consumption of Si epitaxial layer 125, which results in a smaller $\theta_2$ and width Wm and a wider $\theta_3$. Oxide layer 900 and liner layer 600 are not shown in FIGS. 1A-1C, 2, and 3 for ease of description.

In some embodiments, after operation 430, a sacrificial gate electrode 1005 is deposited on fin structures 100 as shown in FIG. 10. In some embodiments, sacrificial gate electrode 1005 does not cover the entire length of fin structures 100 along the x-direction. For example, sacrificial gate electrode 1005 covers a middle section of fin structures 100, leaving the rest of fin structures 100 exposed. Further, after operation 430, width W of fin structures 100 does not substantially change. In some embodiments, during operations 420 and 425, the height of fin structures 100 is successively reduced from operation 410 due to the etching and annealing processes described above.

Figure 11:
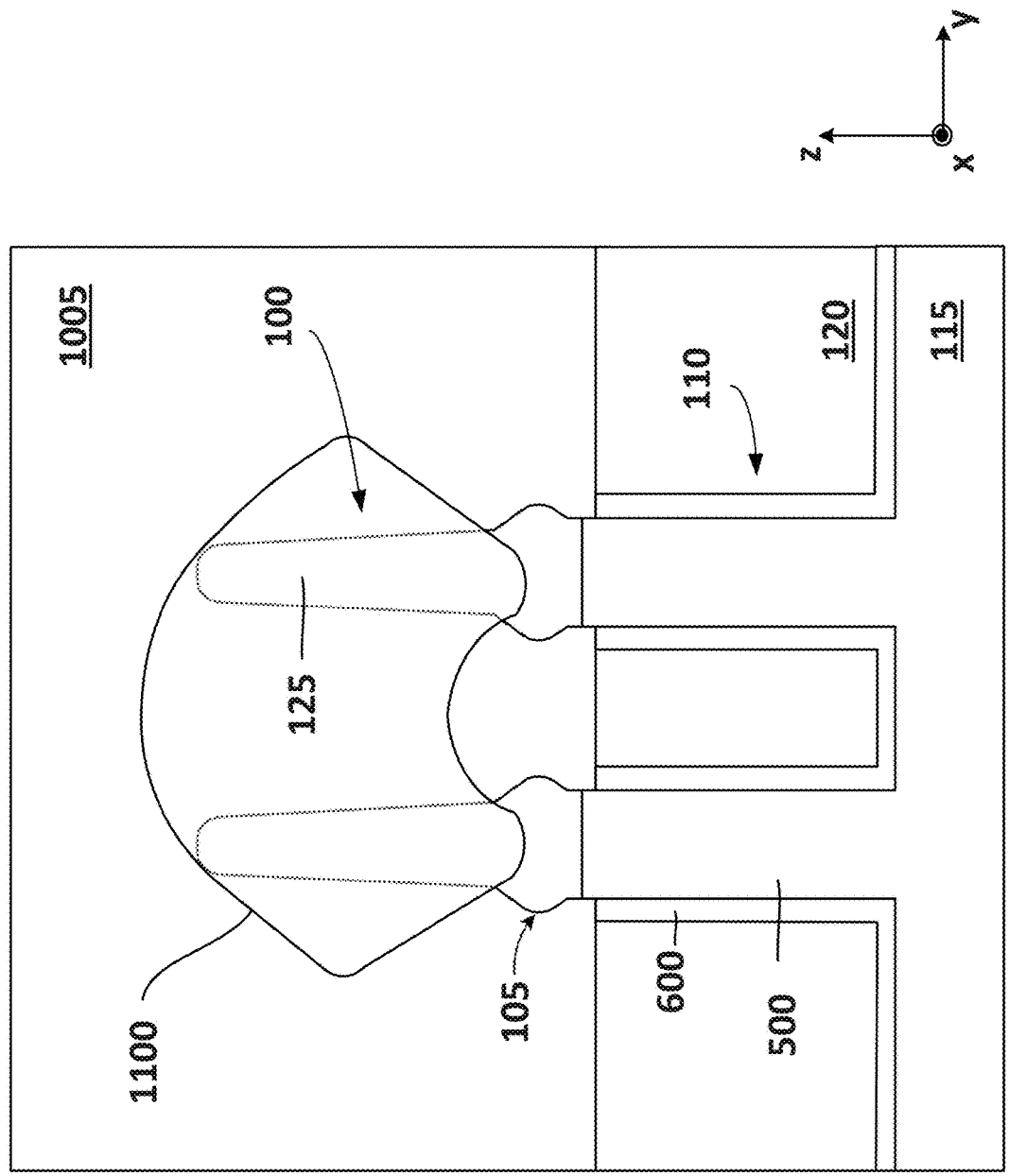
FIG. 11 is a cross-sectional view of a source/drain epitaxial structure grown on fin structures with tapered bottom profiles, in accordance with some embodiments.

In some embodiments, exposed sections of fin structures 100 (e.g., portions of fin structures 100 not covered by sacrificial gate electrode 1005) are stripped from oxide layer 900 (e.g., with an etching process preferentially selective towards oxide layer 900), and a source/drain epitaxial structure 1100 is grown thereon as shown in FIG. 11. In some embodiments, source/drain epitaxial structure 1100 is a merged source/drain epitaxial structure formed by two or more epitaxial layers grown from each fin structure 100. During the final stages of the growth, the two or more epitaxial layers are allowed to merge and form source/drain epitaxial structure 1100 shown in FIG. 11. In some embodiments, source/drain epitaxial structure 1100 includes SiGe for p-type finFETs and carbon doped Si (Si:C) for n-type finFETs.

Method 400 can also be used to form SiGe fin structures shown in FIGS. 1B and 1C. For example, in operation 405, a single SiGe epitaxial layer or a SiGe epitaxial stack can be formed on n-type regions of substrate 115 to form fin structures 100 shown in FIGS. 1B and 1C—which, as discussed above, are suitable for p-type finFETs. In some embodiments, the SiGe epitaxial layer(s) is grown with a heteroepitaxial process using, for example, a CVD process. By way of example and not limitation, precursor gases used for the single SiGe epitaxial layer or the SiGe epitaxial stack growth may include a combination of (i) $SiH_4$, disaline ($Si_2H_6$), $SiH_2Cl_2$, germane ($GeH_4$), or hydrochloric acid (HCl), and (ii) hydrogen ($H_2$), nitrogen ($N_2$), or argon (Ar). In some embodiments, a buffer layer (not shown) may be deposited prior to the growth of SiGe epitaxial layer(s) to suppress growth defects due to the lattice mismatch between the grown SiGe and underlying substrate 115. Further, substrate 115 may be pre-treated prior to the growth of SiGe epitaxial layer(s) to remove native oxide layers formed thereon.

By way of example and not limitation, the Ge concentration during growth can be modulated via the partial pressure of $GeH_4$ and the partial pressure of other gases, such as $SiH_4$, $Si_2H_6$, and $SiH_2Cl_2$, during growth. For example, higher partial pressure of $GeH_4$ or lower partial pressure of $SiH_4$, $Si_2H_6$, or $SiH_2Cl_2$ during growth favor SiGe layers with higher Ge concentration. Lower partial pressure of $GeH_4$ or higher partial pressure of $SiH_4$, $Si_2H_6$, or $SiH_2Cl_2$ favor SiGe layers with a lower Ge concentration.

Various embodiments in accordance with this disclosure describe a method for forming ultra-thin fins with a tapered bottom profile for improved structural rigidity and desirable gate control characteristics. In some embodiments, Si and SiGe ultra-thin fins can be fabricated using the methods described herein. Further, SiGe fins with a Ge variable concentration and a tapered bottom profile can be formed in p-type finFETs for improved gate control over the channel. In some embodiments, the variable Ge concentration of the SiGe fin structures ranges from about 10% to about 35% with higher Ge concentration towards the bottom of the fin structures. In some embodiments, the top width of the ultra-thin fin structures ranges between about 5 nm and about 15 nm and the width of the bottom tapered profile ranges between about 8 nm and about 20 nm. In some embodiments, a first tapered profile is achieved via depositing and reflowing a silicon-based layer on the patterned fin structure, followed by trimming the fin structure with a combination of wet etching and dry etching processes. In some embodiments, the second tapered profile is formed by depositing an oxide layer on the trimmed portions of the fin and subjecting the fin structure to an annealing process that oxidizes the bottom portion of the fin structure more than the top portion of the fin structure.

In some embodiments, a semiconductor structure includes a substrate comprising pedestal structures formed thereon and fin structures formed on the pedestal structures. The fin structure further includes a bottom tapered portion having a bottom width, a middle width, and a top width with the middle width being larger than the bottom width and the top width. The fin structure also includes an upper portion having a width substantially equal to or narrower than the top width of the bottom tapered portion. Further the semiconductor structure includes an isolation material disposed between the pedestal structures.

In some embodiments, a semiconductor structure includes a substrate comprising pedestal structures formed thereon and fin structures formed on the pedestal structures. The fin structures further include a top portion and a tapered bottom portion wider than the top portion where each sidewall of the tapered bottom portion is not coplanar with sidewall surfaces of the top portion of the fin structure and sidewall surfaces of the pedestal structures. Further the semiconductor structure includes an isolation material disposed between the pedestal structures.

In some embodiments, a method includes depositing an epitaxial layer on a doped region of a substrate; patterning the epitaxial layer and the doped region to form a fin structure that includes an epitaxial layer portion and a doped region portion. The method also includes forming an isolation region on the substrate so that a top section of the epitaxial layer portion is above the isolation region; depositing a silicon-based layer on the top portion of the epitaxial layer above the isolation region; annealing the silicon-based layer to reflow the silicon-based layer; and etching the silicon-based layer and the fin structure above the isolation region to form a first bottom tapered profile in the fin structure above the isolation region. The method further includes annealing the fin structure to form a second bottom tapered profile below the first bottom tapered profile and above the isolation region so that the first and second bottom tapered profiles collectively form a bottom profile with a top width, a middle width, and a bottom width where the middle width is greater than each of the top and bottom widths.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A semiconductor structure, comprising:
   a substrate comprising pedestal structures formed thereon;
   a dielectric layer between the pedestal structures and below top surfaces of the pedestal structures; and
   fin structures formed on the pedestal structures, wherein each of the fin structures comprises:
      a bottom epitaxial portion having a bottom width, a middle width, and a top width, wherein the middle width is larger than the bottom width and the top width; and
      an upper portion having a width narrower than the top width of the bottom epitaxial portion.

2. The semiconductor structure of claim 1, wherein the fin structures comprise a silicon epitaxial layer.

3. The semiconductor structure of claim 1, wherein the fin structures comprise a silicon-germanium epitaxial layer with a varying germanium concentration between the upper portion and the bottom epitaxial portion.

4. The semiconductor structure of claim 3, wherein the upper portion comprises a germanium concentration gradient with a germanium peak concentration in a bottom section of the upper portion.

5. The semiconductor structure of claim 3, wherein the bottom epitaxial portion has a larger germanium concentration than the upper portion.

6. The semiconductor structure of claim 1, wherein the width of the upper portion is between about 5 nm and about 15 nm and the middle width is between about 8 nm and about 20 nm.

7. The semiconductor structure of claim 1, wherein the middle width of the bottom epitaxial portion is formed by a sidewall angle of the bottom epitaxial portion measured between a sidewall surface of the upper portion and a sidewall surface of the bottom epitaxial portion.

8. The semiconductor structure of claim 7, wherein the sidewall angle is between about 10° and about 30°.

9. A semiconductor structure, comprising:
   a substrate comprising pedestal structures formed thereon; and
   fin structures formed on the pedestal structures, wherein each of the fin structures comprises a top portion and a bottom epitaxial portion wider than the top portion, wherein a first sidewall of the bottom epitaxial portion is in contact with a second sidewall of the top portion, and wherein the first sidewall is not coplanar with the second sidewall.

10. The semiconductor structure of claim 9, wherein a tapered angle between the first sidewall of the bottom epitaxial portion and the second sidewall of the top portion is between about 10° and about 30°.

11. The semiconductor structure of claim 9, wherein adjoining sidewalls of the bottom epitaxial portion form an angle between about 120° and about 160°.

12. The semiconductor structure of claim 9, wherein the bottom epitaxial portion comprises:
   a top width;
   a middle width;
   and a bottom width, wherein the middle width is greater than each of the top and bottom widths.

13. The semiconductor structure of claim 12, wherein the middle width is between about 8 nm and about 20 nm.

14. The semiconductor structure of claim 12, wherein the bottom width is larger than the top width.

15. The semiconductor structure of claim 12, wherein the middle width is located between about 1 nm and about 3 nm above the pedestal structures.

16. The semiconductor structure of claim 9, further comprising an isolation material disposed between the pedestal structures.

17. A semiconductor structure, comprising:
   a plurality of fin structures, wherein each fin structure of the plurality of fin structures comprises:
      a bottom epitaxial portion having a bottom width, a middle width, and a top width, wherein the middle width is larger than the bottom width and the top width; and
      an upper portion having a width substantially equal to or narrower than the top width of the bottom epitaxial portion, wherein the upper portion comprises a germanium concentration gradient with a germanium peak concentration in a bottom section of the upper portion; and
   a gate electrode disposed between adjacent fin structures of the plurality of fin structures.

18. The semiconductor structure of claim 17, wherein the bottom epitaxial portion has a greater germanium concentration than the upper portion.

19. The semiconductor structure of claim 17, wherein each of the fin structures further comprises a pedestal structure below the bottom epitaxial portion.

20. The semiconductor structure of claim 17, further comprising a dielectric layer between the plurality of fin structures and below a bottom surface of the bottom epitaxial portion of each fin structure of the plurality of fin structures.

* * * * *